United States Patent
Gotoh et al.

(10) Patent No.: US 6,730,858 B2
(45) Date of Patent: May 4, 2004

(54) CIRCUIT BOARD HAVING BONDING AREAS TO BE JOINED WITH BUMPS BY ULTRASONIC BONDING

(75) Inventors: Masashi Gotoh, Ibaraki (JP); Jitsuo Kanazawa, Ibaraki (JP); Syuichiro Yamamoto, Chiba (JP); Kenji Honda, Ibaraki (JP)

(73) Assignee: TDK Corporation, Tokyo (JP)

( * ) Notice: Subject to any disclaimer, the term of this patent is extended or adjusted under 35 U.S.C. 154(b) by 104 days.

(21) Appl. No.: 09/119,626

(22) Filed: Jul. 21, 1998

(65) Prior Publication Data
US 2001/0018982 A1 Sep. 6, 2001

(30) Foreign Application Priority Data

Jul. 22, 1997  (JP) .............................................. 9-210215

(51) Int. Cl.[7] .................................................. H05K 1/16
(52) U.S. Cl. ........................................ 174/260; 174/261
(58) Field of Search ........................ 174/260; 228/179.1, 228/180.1, 180.21, 180.22; 361/767, 768, 771

(56) References Cited

U.S. PATENT DOCUMENTS 3,893,223 A  *  7/1975  Mims ........................... 228/110
3,908,185 A  *  9/1975  Martin ........................ 257/664
5,446,244 A     8/1995  Kawanabe et al.
5,764,485 A  *  6/1998  Lebaschi ..................... 361/774
5,793,098 A     8/1998  Uchida

FOREIGN PATENT DOCUMENTS

| JP | 54083374 | 7/1979 |
|---|---|---|
| JP | 4-65909 | 3/1992 |
| JP | 07263849 | 10/1995 |

OTHER PUBLICATIONS

U.S. patent application Ser. No. 09/119,626, filed Jul. 21, 1998, pending.
U.S. patent application Ser. No. 09/221,124, filed Dec. 28, 1998, pending.

* cited by examiner

Primary Examiner—David L. Talbott
Assistant Examiner—Jeremy Norris
(74) Attorney, Agent, or Firm—Oblon, Spivak, McClelland, Maier & Neustadt, P.C.

(57) ABSTRACT

A circuit board for mounting a part having a plurality of bumps by ultrasonic bonding. The circuit board includes a main body and a conductive layer provided on the main body. The conductive layer has a conductive pattern having at least one bonding area configured to correspond to the plurality of bumps of the part. The conductive layer has an isolated notch part located proximate the at least one bonding area.

11 Claims, 6 Drawing Sheets

CIRCUIT BOARD HAVING BONDING AREAS TO BE JOINED WITH BUMPS BY ULTRASONIC BONDING

BACKGROUND OF THE INVENTION

This invention relates to a circuit board comprising a conductive pattern section with a pattern formed on a conductive layer on a substrate and in particular to a circuit board in which bonding areas are defined in a conductive pattern section and an ultrasonic bonding method is used to join bumps of a part mounted on the board.

A circuit board comprising a conductive layer such as copper foil bonded to a substrate and formed in a desired pattern for realizing wiring connection is used as a card-type printed-circuit board used with a large electronic machine. In addition, in recent years, various circuit boards, large and small, have been used diversely as high-density packaging methods of multi-chip mounting, bear chip mounting, etc., have become pervasive. Examples of the circuit boards are a circuit board to which a chip part is directly bonded with face down, a circuit board to which bumps and tabs can be bonded ultrasonically, and a circuit board serving as both a wiring board and a vessel of parts for use with electronic parts.

A circuit board for use with a chip-type surface acoustic wave device will be discussed with reference to FIG. 11 and FIG. 12 as a recent circuit board example dealing with high-density packaging of the prior art.

FIG. 11 is an assembly view to show the structure of a conventional surface acoustic wave device. For purposes of signal input/output, ground connection, and as required, power connection, eight electrodes bumps (simply bumps) 22 each about several ten microns high are installed on one side (rear side in FIG. 11) of a surface acoustic wave chip 21 of a niobium acid lithium crystal, etc., which will be hereinafter called chip 21. A circuit board 23 on which the chip 21 is placed comprises a conductive pattern section 24 with a pattern formed on a conductive layer, and bonding areas 25 are defined in the conductive pattern section 24 as predetermined areas in which the bumps 22 are bonded ultrasonically and secured fixedly. The bonding area 25 is an area comprising a bonding position that the bump 22 directly strikes and a portion where the bump is spread, welded, and joined by ultrasonic bonding. After the chip 21 is placed on the circuit board 23 by ultrasonic bonding, the circuit board 23 is housed in a vessel 26 and sealed by a lid 27. Such a related art example can also be seen in Unexamined Japanese Patent Publication 4-65909.

The circuit board 23 generally comprises metal foil of copper, etc., about 12–75 microns thick deposited as a conductive layer via an adhesive layer about several ten microns thick on an insulating substrate of a resin, ceramics, etc., about 0.2–2.5 millimeters thick, the conductive layer being etched in a desired pattern for forming a plane circuit of the conductive pattern section 24. In recent circuit boards, a conductive layer is etched in a width or space of about several hundred microns for forming a high-precision conductive pattern section.

Ultrasonic bonding for mounting a part with bumps on the circuit board will be discussed with reference to FIG. 12. First, the chip 21 with the bump 22 face down is attracted at the chip of a head section 29 of a ultrasonic bonder 28. Next, each of the bumps 22 is aligned with the center of each bonding area (bonding position) in the conductive pattern section 24 on the circuit board 23, the head section 29 is brought down, and the bumps 22 are pressed against the surface of the conductive pattern section 24. Ultrasound is added to the bumps 22 via the chip 21 from the head section 29 and ultrasonic energy is used to join the bumps 22 and the conductive pattern section 24 for fixedly securing the chip 21 to the circuit board 23.

However, according to the related art, the following problems remain unsolved:

To ultrasonically bond a part provided with bumps onto a circuit board, it is difficult to provide all bumps with the same degree of bonding strength and the bonding strength varies from one bump to another.

To ultrasonically bond the bumps to the bonding areas, essentially it is desirable to apply optimum ultrasonic bonding energy to the bumps in response to the bump shape, the conductive pattern section form containing the bonding areas, and the like. For example, to ultrasonically bond the bumps to the bonding areas of comparatively narrow conductive land portions separated in three directions by the pattern boundary as shown in conductive lands 24a in the conductive pattern section 24 in FIG. 11, it is desirable to apply comparatively strong ultrasonic energy for a long time and enlarge load imposed on the chip.

To ultrasonically bond the bumps to the bonding areas of comparatively wide conductive land portions as shown in conductive lands 24b in the conductive pattern section 24 in FIG. 11, it is not necessary to apply strong ultrasonic energy to the bumps or impose large load thereon; if too strong ultrasonic energy is applied to the bumps, the circuit board or the chip is cracked and broken, etc.

However, on the one hand, usually the shape and area of the conductive pattern section formed in the circuit board vary diversely depending on the electric signal type, current capacity, pattern application, etc.; on the other hand, the ultrasonic energy applied to the chip from the head section of the ultrasonic bonder is distributed only mechanically simply among the bumps by pressing the chip against the conductive pattern section.

It is desirable to apply appropriate ultrasonic energy separately to each of the bumps combined with the bonding areas. In fact, however, joining energy cannot be adjusted. Resultantly, to ultrasonically bond a chip provided with bumps to a circuit board, the energy for joining the bumps and bonding areas becomes too much or too little; the ultrasonic bonding failure rate is high and the joint parts also lack reliability.

Further, taking a flexible manufacturing system or an automatic packaging apparatus with a robot as the recent trend as an example, to use one ultrasonic bonder to ultrasonically bond a chip with bumps to various circuit boards or various parts with bumps to points of a large circuit board in multi-chip mounting, etc., the operation conditions of the ultrasonic bonder must be again adjusted to the optimum bonding conditions each time the circuit board type changes or the conductive pattern section shape or the number of bumps of a part varies; thus there is a serious defect of lacking practicality because the substantial productivity extremely lowers.

Resultantly, to mount a chip with bumps on a circuit board, the ultrasonic bonding involves problems of lacking versatility, poor conductivity, and lacking reliability after joining.

SUMMARY OF THE INVENTION

It is therefore an object of the invention to provide a circuit board which enables a chip with bumps to be fixedly secured to bonding areas in a conductive pattern area on the circuit board evenly in high bonding strength.

Other and further objects and new features of the invention will become apparent from the following description of embodiments.

To the end, according to a first aspect of the invention, there is provided a circuit board comprising a conductive pattern section with a pattern formed on a conductive layer provided on a board main body, wherein two or more bonding positions that bumps of a part mounted by ultrasonic bonding strike are set in the conductive pattern section, characterized in that an isolated notch part or recess (for example, an island-like notch or recess pattern surrounded on four sides by the level difference from the conductive layer) is formed in the conductive layer in the proximity of at least one bonding position.

According to a second aspect of the invention, there is provided a circuit board comprising a conductive pattern section with a pattern formed on a conductive layer provided on a board main body, wherein two or more bonding positions that bumps of a part mounted by ultrasonic bonding strike are set in the conductive pattern section, characterized in that in the conductive layer in the proximity of at least one bonding position, a notch part or a recess extending from the margin of the conductive pattern section to the inside thereof and reaching the proximity of the bonding position (for example, a groove-like notch or recess pattern surrounded on three sides by the level difference from the conductive layer) is formed.

In the above-mentioned circuit boards of the invention, the notch part or the recess may be formed extending in a direction crossing the ultrasonically vibrating direction of the ultrasonic bonding.

The notch part or the recess may partially narrow the conductive pattern section (for example, to a constricted shape) to form a narrow pattern part.

DETAILED DESCRIPTION OF THE PREFERRED EMBODIMENTS

Referring now to the accompanying drawings, there are shown preferred embodiments of circuit boards according to the invention.

Figure 1:
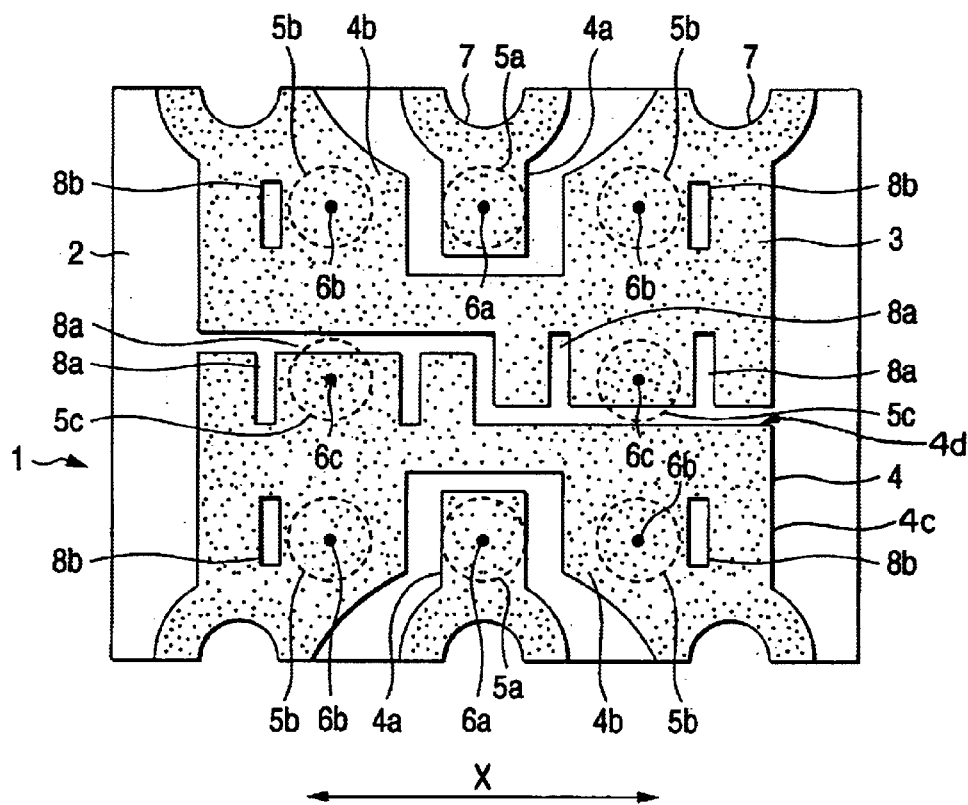
FIG. 1 is a plan view showing a first embodiment of a circuit board according to the invention.
Figure 2:
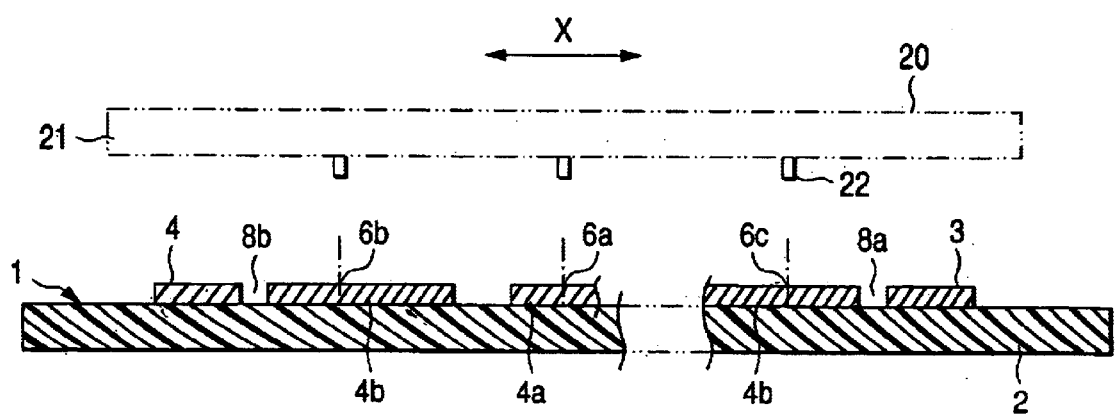
FIG. 2 is a sectional view showing the first embodiment of the circuit board according to the invention.
Figure 11:
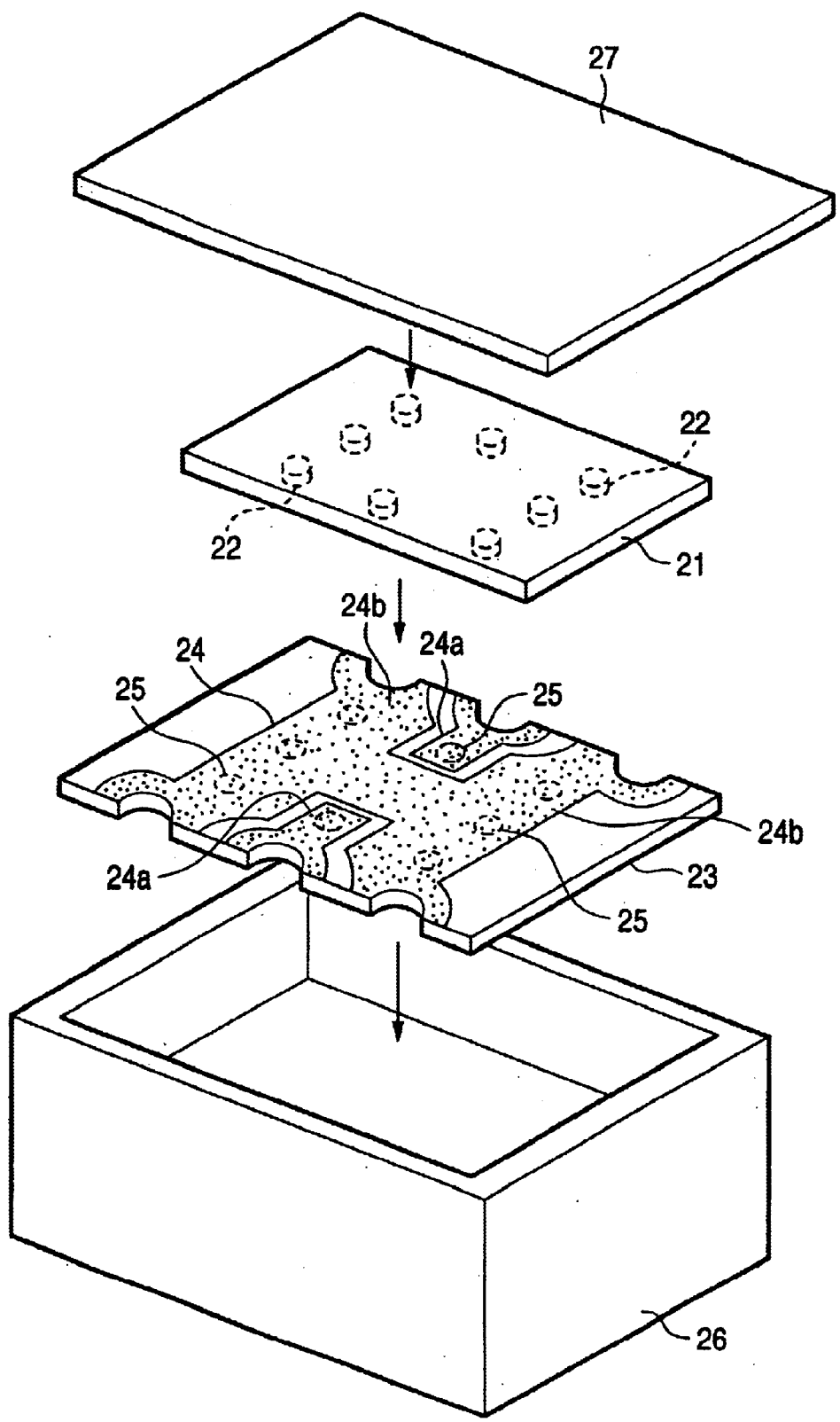
FIG. 11 is an assembly view showing related art.

FIG. 1 is a plan view showing a first embodiment of a circuit board according to the invention and FIG. 2 is a frontal sectional view. As shown in the figures, a circuit board 1 comprises a conductive layer 3 deposited on a board main body 2 and a conductive pattern section 4 with a desired pattern formed on the conductive layer 3. A part 20 mounted with face down on the circuit board 1, indicated by the phantom line in FIG. 2 comprises a plurality of bumps 22 provided on one chip 21 (like the chip shown in FIG. 11, for example,) and a plurality of bonding areas 5a, 5b, and 5c as areas where the bumps are fixedly secured by a ultrasonic bonding method are defined in the conductive pattern section 4. The bonding area is an area comprising a bonding position that the bump 22 directly strikes and a portion where the bump is spread and welded by ultrasonic bonding.

The bonding area 5a exists in a conductive land 4a having a comparatively narrow conductive pattern width for transferring signals in the conductive pattern section 4 and the bonding areas 5b and 5c exist in conductive lands 4b having a comparatively wide conductive pattern width used as ground and a power supply. The centers of the bonding areas 5a, 5b, and 5c are bonding positions 6a, 6b, 6c respectively where the bumps are pressed against the conductive layer 3. Further, the conductive lands 4a and 4b in the conductive pattern section 4 extend to the margins of the circuit board 1 to form terminal parts 7 for connecting the circuit board to the outside.

The material for forming the board main body 2 may be a material if it has sufficient strength; it may be an insulative epoxy resin or ceramics or a metal substrate comprising an insulating layer deposited on a metal plate. The conductive layer may be made of a conductive material capable of transmitting electric signals; it may be a conductor of metal foil of copper, gold, nickel, etc., a calcined thick-film conductive layer, or the like. The conductor is coated on the surface with a plated layer of nickel, metal, etc., whereby the bondability can also be enhanced.

As the main part of the first embodiment of the invention, notches 8a and 8b are made so as to enable good ultrasonic bonding in conductive layer portions on the margins of the bonding areas 5a, 5b, and 5c contained in the conductive pattern section 4 (in or in the proximity of the bonding areas 5a, 5b, and 5c, namely, in the proximity of the bonding positions 6a, 6b, and 6c). The notches 8a and 8b are not required for electric connection. Both of the notches 8a and 8b need not be provided. The notch 8a is a blank pattern with the conductive layer lost, surrounding the three sides of the surrounding of the conductive layer 3 containing the bonding area 5c with one end reaching the margin or the proximity of the bonding area 5c and the other end extending to the margin of the conductive pattern section 4. According to the plane view of FIG. 1, the notch 8a is formed as a belt-like slit extending from the margin 4c of the conductive pattern section 4 to the inside 4d thereof and reaching the margin of the bonding area 5c. The notch part 8b is a blank pattern isolated inside the conductive pattern section 4 from the margin thereof; it is formed like an island-like slit discontinuous with the margin of the conductive pattern section. The notches 8a and 8b are formed as blank patterns with the conductive layer 3 not deposited on the board main body 2 from the beginning or with the conductive layer 3 deposited on the board main body 2 removed in a predetermined width.

In FIG. 1, ultrasonic vibration applied when ultrasonic bonding is performed is in the arrow X direction and the notch part 8a, 8b has at least a blank pattern portion oriented in a direction crossing the ultrasonically vibrating direction (X direction).

The notch part 8a, 8b is set to a position and shape relative to the bonding area on the circuit board 1 so that substantial joining energy applied to each bonding area is adjusted uniformly.

According to the first embodiment, the notch part 8a, 8b in the direction crossing the ultrasonically vibrating direction (X direction) is made in the conductive land 4b in the conductive pattern section 4, so that the bonding area 5b, 5c in the conductive land 4b is physically limited in the region in the X direction of the conductive layer spreading in the bonding area 5b, 5c and the width of the conductive layer of the conductive land 4b linked to the bonding area 5b, 5c becomes a narrow pattern part narrowed down by the notch part 8a, 8b, which becomes closely analogous to the narrow region of the conductive land 4a containing the bonding area 5a. This means that their ultrasonic bonding conditions become closely analogous to each other. Resultantly, if the conductive pattern section 4 containing the bonding areas 5a, 5b, and 5c is not even, uniform ultrasonic energy is applied to every bonding area and joining energy applied to the bumps 22 on the chip 21 and the conductive layers of the bonding areas at the ultrasonic bonding time can be adjusted uniformly. Therefore, the energy for joining the bumps and bonding areas can be prevented from becoming too much or too little and a joining failure can be prevented. The reason why the notch part 8a, 8b has a blank pattern portion oriented in the direction crossing the ultrasonically vibrating direction (X direction) is that the conductive layer width in the ultrasonically vibrating direction (X direction) surrounding the bonding area 5a, 5b, 5c largely affects the ultrasonic bonding conditions.

In the first embodiment, a laminated substrate of a bismaleimide triazine resin 75-mm square 0.5 mm thick is used as the board main body 2 and the conductive layer 3 is coated with a copper-plated layer 10 microns thick, a nickel-plated layer 5–10 microns thick, and a gold-plated layer 0.5–1 micron thick on copper foil 18 microns thick deposited on the substrate. The circuit board 1 is cut to several mm per side by dicing after a chip is mounted thereon, and finally is separated to the shape shown in the figure. A surface acoustic wave chip element of a niobium acid lithium crystal (similar to the chip 21 previously described with reference to FIG. 11) is used as a part mounted with face down on the circuit board and eight bumps each 25 microns in diameter are provided on one side of the chip element. The conductive layer is etched for forming notch parts of blank patterns like elongated slits 50–150 microns wide surrounding the bonding areas 5a, 5b, and 5c.

Figure 12:
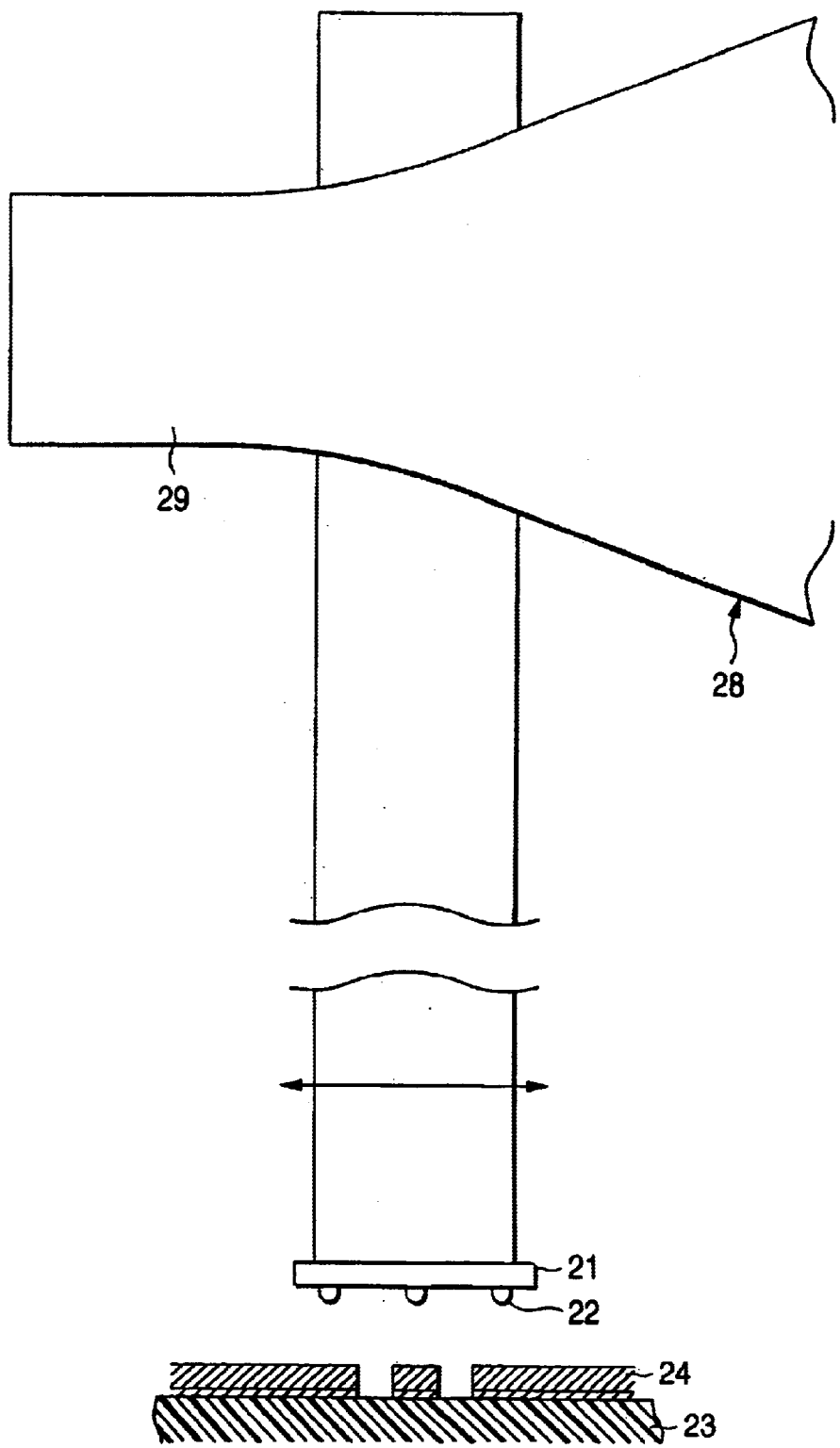
FIG. 12 is a schematic representation showing ultrasonic bonding.

In the embodiment, the chip 21 indicated by the phantom line was attracted to a head section of a ultrasonic bonder as shown in FIG. 12 and the bumps 22 were aligned with the bonding areas 5a, 5b, and 5c of the circuit board 1. While the bumps were pressed against the conductive layer with 700 g of pressure under the condition heated to 100° C., ultrasound at frequency 60 kHz with ultrasonic output 1.5 W was applied for 0.5 sec for executing ultrasonic bonding.

Figure 4:
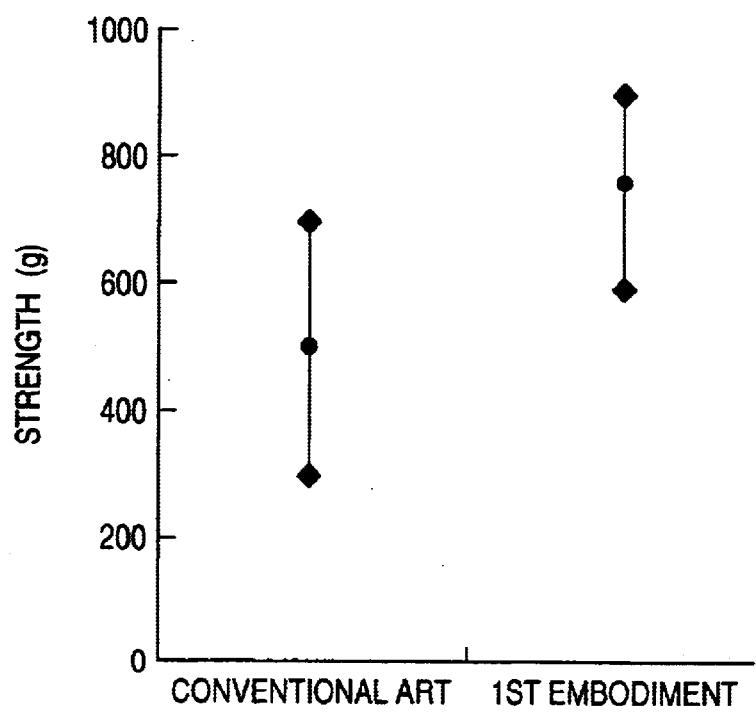
FIG. 4 is a graph showing the strength test result of the circuit board in the first embodiment of the invention in comparison with that according to related art.

FIG. 4 is a graph to show the measurement result of the join strength and variations of ultrasonic bonding provided by the embodiment by applying a stress in a shear direction in comparison with the join strength according to the related art. With the conventional circuit board having the conductive pattern section not provided with notch parts to make excellent ultrasonic bonding, the average join strength was 500 g, the maximum strength was 700 g, and the minimum strength was 300 g; according to the embodiment, the average join strength was remarkably enhanced to 760 g, the maximum strength also to 900 g and even the minimum strength to 600 g.

Further, to be noted, according to the destruction test result, destruction mode in which peeling off occurs between the bumps and metal plating on the substrate occurs no less than 15% according to the conventional example, but in the embodiment, such a peeling mode is non-existent and destruction mode caused by element destruction or element electrode destruction, etc., is indicated.

According to the first embodiment, since the notch parts 8a and 8b are made in the conductive pattern section 4, the conditions surrounding the bonding areas 5a, 5b, and 5c are adjusted uniformly and ultrasonic energy applied to the bumps on the mounted part side and the bonding areas 5a, 5b, and 5c can become effective joining energy neither too much nor too little and act on the bumps for bonding the bumps strongly and more evenly. This trend is noticeable particularly when a resin substrate is used as the board main body 2.

In the description of the first embodiment, the conductive layer 3 is described as being etched to form slits for the notch parts 8a and 8b. In such a process, during the formation of the thick-film conductive layer, masking is executed through a screen so that the screen prevents the depositing of portions of the thick-film conductive layer on the board main body where the notch parts are located. Of course, the notch parts 8a and 8b can also be formed by laser beam machining, etc., and the conductive layer 3 can also be slit by post-treatment processes to form the notch parts. If post-treatment processes are used to form the notch parts, a part is actually mounted on a circuit board as a test, variations in the join strength of ultrasonic bonding are measured, and the position, length, and shape of each notch part when the circuit board notch parts are formed by post-treatment at mass production time can be set according to the measurement result.

In the first embodiment, the 8a and 8b are provided in the conductive pattern section 4 by removing the conductive layer 3 in the thickness direction to the board main body 2. However, the conductive layer 3 to the board main body 2 all in the thickness direction need not necessarily be removed. Recesses may be formed so as to thin the conductive layer to such an extent that ultrasonic bonding propagation conditions can be substantially adjusted uniformly, as shown in FIG. 3 as a second embodiment of the invention.

Figure 3:
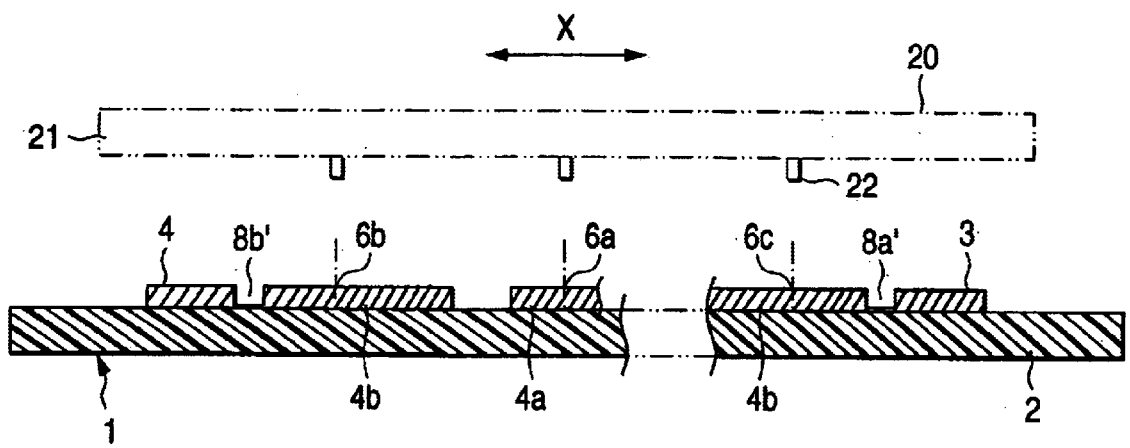
FIG. 3 is a sectional view showing a second embodiment of the invention.

In the second embodiment in FIG. 3, a conductive layer 3 is thinned to form recesses 8a' and 8b' in a conductive pattern section 4 on a board main body 2 in place of the notch parts 8a and 8b in the first embodiment. Parts identical with or similar to those previously described with reference to FIG. 1 and FIG. 2 are denoted by the same reference numerals in FIG. 3 and will not be discussed again.

Also in the second embodiment, the ultrasonic bonding conditions of the conductive pattern section 4 surrounding bonding areas 5a, 5b, and 5c are adjusted uniformly, whereby ultrasonic energy can be applied to bumps 22 on the mounted part side and the bonding areas 5a, 5b, and 5c neither too much nor too little and strong bump bonding can be accomplished. The second embodiment is advantageous to form the recesses 8a' and 8b' in post-treatment such as laser beam machining.

Figure 5:
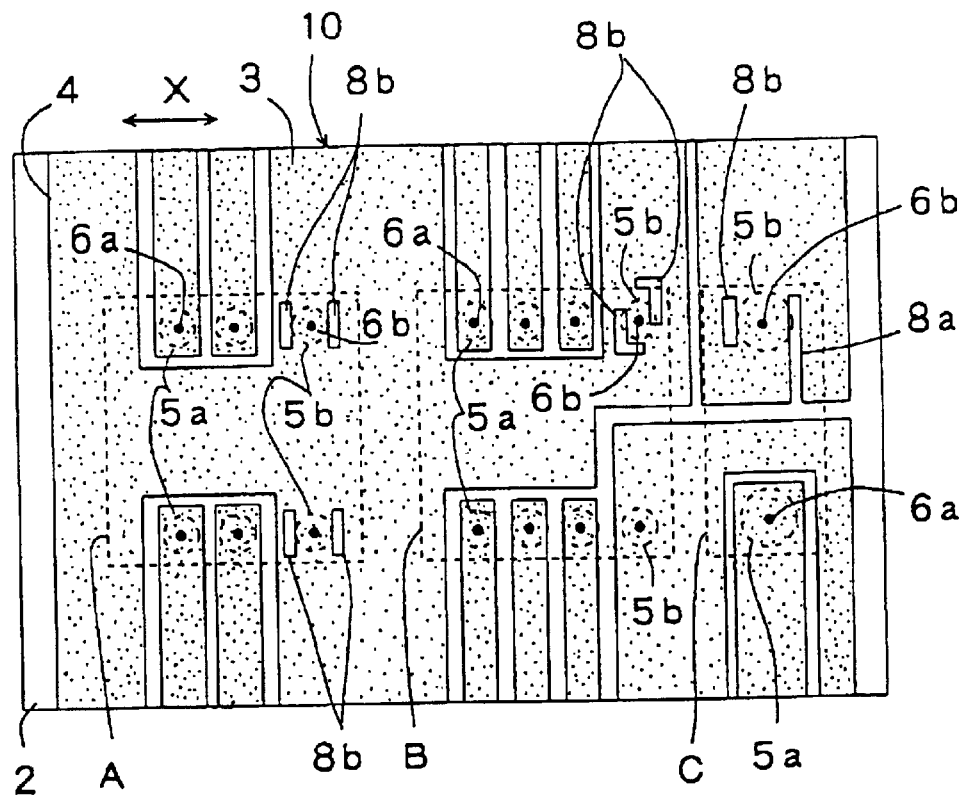
FIG. 5 is a plan view showing a third embodiment of the invention.
Figure 6:
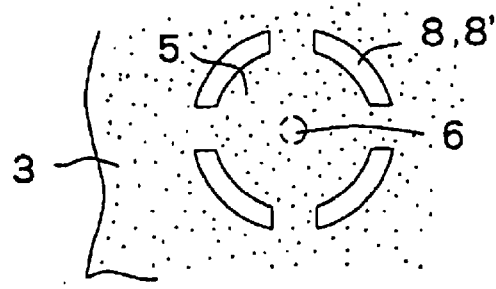
FIG. 6 is a plan view showing a modified embodiment of notch parts or recesses as arc-like notches or recesses according to the invention.
Figure 7:
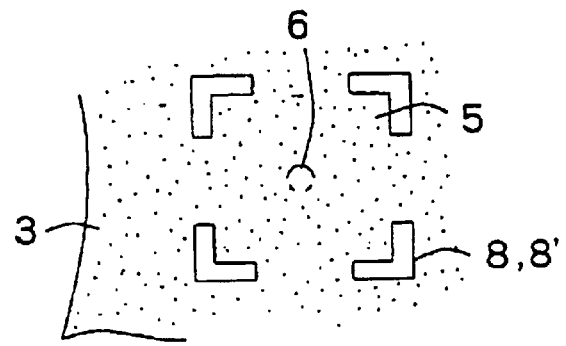
FIG. 7 is a plan view showing a modified embodiment of notch parts or recesses as L-shaped notches or recesses according to the invention.
Figure 8:
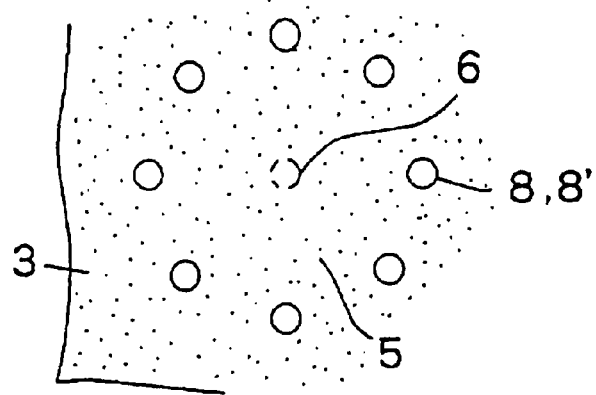
FIG. 8 is a plan view showing a modified embodiment of notch parts or recesses as circular notches or recesses according to the invention.

The first and second embodiments assume that one part is bonded onto the circuit board with face down. However, the invention essentially can also be applied to multi-chip mounting. This will be discussed with reference to FIG. 5 as a third embodiment of the invention. That is, as shown in FIG. 5, a conductive pattern section 4 with a pattern formed on a conductive layer 3 is provided on a circuit board 10 and to mount parts A, B, and C different in the number of bumps on the circuit board 10, bonding areas 5a and 5b are set in the conductive pattern section 4 as areas where the bumps of the parts are ultrasonically bonded. Moreover, notch parts 8a, 8b of blank patterns are formed in the conductive layer in or in the proximity of at least one bonding area (in other words, in the proximity of at least one bonding position 6a, 6b). The notch parts 8a, 8b made in the conductive layer in or in the proximity of the bonding area differ in shape and placement in response to the corresponding parts. Particularly, the third embodiment differs from the first embodiment in that the notch parts 8a, 8b different in shape and placement are formed in response to the number of the bumps contained in each part A, B, C (six, eight, two). Parts identical with or similar to those previously described with reference to FIG. 1 and FIG. 2 are denoted by the same reference numerals in FIG. 5 and will not be discussed again.

According to the third embodiment, if the same ultrasonic energy is applied to or the same load is imposed on parts from a head section of a ultrasonic holder, the shapes or positions of the notch parts 8a, 8b formed in the conductive pattern section 4 in response to the number of the bumps are set so as to match their corresponding parts. Thus, to mount parts different in the number of bumps on a single circuit board, the ultrasonic joining energy applied to the bumps and the bonding areas can be adjusted uniformly. In particular, the embodiment provides a special advantage of enabling multi-chip mounting even using a simple ultrasonic holder having no capability of programming ultrasonic output.

In the third embodiment, if recesses are formed by leaving a little the thickness of the conductive layer 3 in place of notch parts 8a, 8b, a similar advantage is provided.

Figure 9:
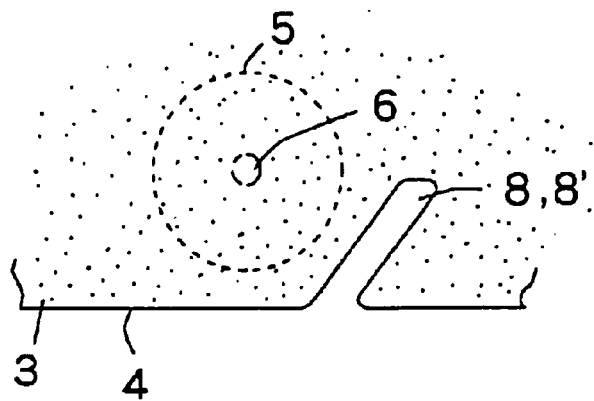
FIG. 9 is a plan view showing a modified embodiment of notch parts or recesses as slits formed slantingly from the margin of a conductive pattern section according to the invention.
Figure 10:
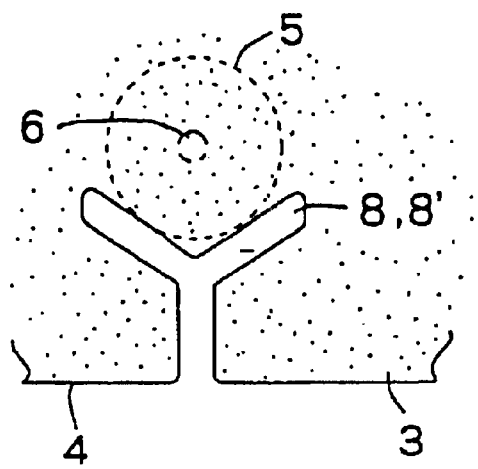
FIG. 10 is a plan view showing a modified embodiment of notch parts or recesses as slits formed so as to branch to two parts from the margin of a conductive pattern section according to the invention.

FIG. 6 to FIG. 10 show modified embodiments of notch parts 8 or recesses 8' each formed in or in the proximity of a bonding area 5, in other words, in the proximity of a bonding position 6. Each notch part 8 is a blank pattern provided by removing a conductive layer 3 all in the thickness direction and each recess 8' is provided by leaving a little the thickness of the conductive layer 3. The notch part or the recess is not limited to a linear or rectangular slit and may be an arc-like notch part 8 or an arc-like recess 8' in FIG. 6, an L-shaped notch part 8 or an L-shaped recess 8' in FIG. 7, or a circular (dot-like) notch part 8 or a circular (dot-like) recess 8' in FIG. 8; more than one notch part or recess may be made so as to surround the bonding position 6. As shown in FIG. 9, a notch part 8 or a recess 8' may be formed in the conductive layer in such a manner that it is inclined from the margin of the conductive pattern section 4. As shown in FIG. 10, a notch part 8 or a recess 8' may be formed in the conductive layer in such a manner that it is made to branch to two parts from the margin of the conductive pattern section 4.

Further, the invention also contains setting of a notch part or a recess to an optimum shape such as a wedge or a zigzag according to the circumstances although not shown. Particularly, if a cross-shaped slit is adopted as the notch part or recess, it becomes a positioning target at the bonding time and can be used as a corner mark, an orientation mark, a polarity mark, etc.

In any way, since the notch parts or recesses are made in the conductive layer in the proximity of each bonding position, the ultrasonic energy applied from each bump to the corresponding bonding area in the conductive pattern section is applied under similar propagation conditions to those in a narrow conductive land as compared with the case where notch parts or recesses do not exist in a wide conductive land. Resultantly, ultrasonic energy can be applied neither too much nor too little for bonding under bonding conditions equal to those when each bump is ultrasonically bonded to the bonding area in a narrow conductive pattern section.

If the notch part or recess formation is applied to a portion of a comparatively wide conductive land, such as a ground pattern, a shield pattern, a power supply pattern, or a discarded pattern for reinforcement, rather than a comparatively narrow conductive land for input/output signals among conductive lands in the conductive pattern section, an exceptional advantage is produced.

It is not necessary to make notches or recesses according to the invention in all conductive lands on the circuit board, needless to say.

As many apparently widely different embodiments of this invention may be made without departing from the spirit and scope thereof, it is to be understood that the invention is not limited to the specific embodiments thereof.

As described above, according to the invention, the circuit board comprises the conductive pattern section with a pattern formed on the conductive layer provided on the board main body, wherein two or more bonding positions that bumps of a part mounted by ultrasonic bonding strike are set in the conductive pattern section, characterized in that an isolated notch part or recess or a notch part or a recess extending from the margin of the conductive pattern section to the inside thereof and reaching the proximity of the bonding position is formed in the conductive layer in the proximity of at least one bonding position. Thus, substantial joining energy applied to each bonding area can be adjusted uniformly in the bonding areas containing the bonding positions. Resultantly, to ultrasonically bond a chip with bumps to the circuit board, joining energy can act on joining of the bumps and the bonding ares neither too much nor too little and the ultrasonic bonding joining strength can be enhanced evenly for remarkably lowering a ultrasonic boding failure rate and enabling excellent-reliability ultrasonic bonding.

What is claimed is:

1. A chip part device comprising:
   a circuit board including a board main body and a conductive layer formed on said board main body, said conductive layer having a plurality of bonding areas defined by a conductive pattern; and
   a chip element mounted on said circuit board, and having a plurality of bump electrodes which are joined with said bonding areas by ultrasonic bonding,
   wherein said circuit board includes at least two grooves defined by said conductive pattern, and located approximate to one of said bonding areas to put the bonding area therebetween, and wherein said at least two grooves do not extend into said board main body.

2. A chip part device as claimed in claim 1, wherein said groove is formed extending in a direction traversing an ultrasonically vibrating direction of the ultrasonic bonding.

3. A chip part device as claimed in claim 1, wherein said at least two grooves is provided in said conductive layer as at least one of an isolated notch part and a recess located proximate to and not extending within said one of said bonding areas, wherein said notch part or recess partially narrows said conductive pattern to form a narrow pattern part.

4. A chip part device comprising:
a circuit board including a board main body and a conductive layer formed on said board main body, said conductive layer having a plurality of bonding areas defined by a conductive pattern; and
a chip element mounted on said circuit board, and having a plurality of bump electrodes which are simultaneously joined with said bonding areas by ultrasonic bonding,
wherein said circuit board includes at least two grooves defined by said conductive pattern and located approximate to one of said bonding areas to put the bonding area therebetween, and wherein at least one of said grooves does not electrically isolate said conductive pattern.

5. A chip part device as claimed in claim 4, wherein said groove is formed extending in a direction traversing an ultrasonically vibrating direction of the ultrasonic bonding.

6. A chip part device as claimed in claim 4, wherein said at least two grooves is provided in said conductive layer as at least one of an isolated notch part and a recess located proximate to and not extending within said one of said bonding areas, wherein said notch part or recess partially narrows said conductive pattern to form a narrow pattern part.

7. A chip part device comprising:
a circuit board including a board main body and a conductive layer formed on said board main body, said conductive layer having a plurality of bonding areas defined by a conductive pattern; and
a chip element mounted on said circuit board, and having a plurality of bump electrodes which are simultaneously joined with said bonding areas by ultrasonic bonding,
wherein said circuit board includes means for evenly distributing ultrasonic energy applied in a vibrating direction to said plurality of bump electrodes and said plurality of bonding areas.

8. A chip part device as claimed in claim 7, wherein said means for distributing ultrasonic energy comprises at least two grooves defined by said conductive pattern and located approximate to one of said bonding areas to put the bonding area therebetween, and wherein at least one of said grooves does not electrically isolate said conductive pattern.

9. A chip part device as claimed in claim 7, wherein said means for evenly distributing ultrasonic energy comprises at least two grooves defined by said conductive pattern and located approximate to one of said bonding areas to put the bonding area therebetween, and wherein said at least two grooves do not extend into said board main body.

10. A chip part device as claimed in claim 9, wherein said groove is formed extending in a direction traversing an ultrasonically vibrating direction of the ultrasonic bonding.

11. A chip part device as claimed in claim 9, wherein said at least two grooves is provided in said conductive layer as at least one of an isolated notch part and a recess located proximate to and not extending within said one of said bonding areas, wherein said notch part or recess partially narrows said conductive pattern to form a narrow pattern part.

* * * * *